United States Patent
Wen et al.

(10) Patent No.: US 6,841,811 B2
(45) Date of Patent: Jan. 11, 2005

(54) LARGE AREA, FAST FRAME RATE CHARGE COUPLED DEVICE

(75) Inventors: David Wen, Los Altos, CA (US); Steve Onishi, San Jose, CA (US)

(73) Assignee: Fairchild Imaging, Milpitas, CA (US)

( * ) Notice: Subject to any disclaimer, the term of this patent is extended or adjusted under 35 U.S.C. 154(b) by 0 days.

(21) Appl. No.: 10/641,640

(22) Filed: Aug. 14, 2003

(65) Prior Publication Data

US 2004/0033656 A1 Feb. 19, 2004

Related U.S. Application Data

(62) Division of application No. 10/198,269, filed on Jul. 16, 2002.

(51) Int. Cl.$^7$ ............................................. H01L 27/148
(52) U.S. Cl. ...................... 257/217; 257/231; 257/233; 257/246
(58) Field of Search ................................ 257/217, 231, 257/233, 246, 247

(56) References Cited

U.S. PATENT DOCUMENTS

| | | | | |
|---|---|---|---|---|
| 4,047,215 A | * | 9/1977 | Frye et al. | ................... 257/247 |
| 4,229,752 A | * | 10/1980 | Hynecek | ..................... 257/217 |
| 4,732,868 A | | 3/1988 | Nichols | |
| 4,910,569 A | | 3/1990 | Erhardt | |
| 4,992,392 A | | 2/1991 | Nichols et al. | |
| 5,220,185 A | | 6/1993 | Wada | |
| 5,250,824 A | | 10/1993 | Janesick | |
| 5,286,988 A | | 2/1994 | Nishi | |
| 5,286,990 A | * | 2/1994 | Hynecek | ..................... 257/247 |
| 5,385,860 A | | 1/1995 | Watanabe | |
| 5,530,475 A | | 6/1996 | Kannegundla et al. | |
| 5,641,700 A | * | 6/1997 | Hawkins et al. | ............. 257/246 |
| 5,693,948 A | | 12/1997 | Sayed et al. | |
| 5,814,810 A | | 9/1998 | Anagnostopoulos | |
| 6,351,001 B1 | | 2/2002 | Stevens et al. | |
| 6,384,436 B1 | * | 5/2002 | Kudoh et al. | ................ 257/231 |

FOREIGN PATENT DOCUMENTS

JP          7074344          3/1995

OTHER PUBLICATIONS

Viper–Digital, High Perfomance PCI Frame Grabber for Multitap Digital Cameras, Correco Imaging.
Complete 14–Bit CCD/CIS Signal Processor AD9814, Analog Devices, One Technology Way, Norwood, MA.

* cited by examiner

*Primary Examiner*—David Nelms
*Assistant Examiner*—Dao H. Nguyen
(74) *Attorney, Agent, or Firm*—Townsend and Townsend and Crew LLP; Steven J. Cahill

(57) ABSTRACT

Large area, fast frame rate, charge coupled devices (CCDs) are provided. Interline transfer CCDs can have interleaved pinned photodiodes and vertical shift registers. The interline transfer CCDs are ideal for producing high frame rate video images from a continuous light source. The photodiodes transfer charge indicative of the previous video frame to an adjacent vertical shift register with little or no lag, while light from the current video frame is integrating in the photodiodes. The charge signals only have to travel a short distance from a photodiode to an adjacent vertical shift register. The charge signals indicative of each video frame are then shifted out of the vertical shift registers. Each vertical shift register has a doping gradient that increases the charge transfer rate. All of these factors provide a fast and efficient video frame rate, even in a large area CCD.

15 Claims, 4 Drawing Sheets

LARGE AREA, FAST FRAME RATE CHARGE COUPLED DEVICE

CROSS-REFERENCES TO RELATED APPLICATIONS

This patent application is a divisional application of U.S. patent application Ser. No. 10/198,269 filed Jul. 16, 2002 and is related to U.S. patent application Ser. No. 10/197,967, filed Jul. 16, 2002, which is incorporated by reference herein.

BACKGROUND OF THE INVENTION

Charge coupled devices (CCDs) are light sensitive elements that are formed on a semiconductor wafer. CCDs contain a plurality of photodetecting picture elements (pixels). The pixels can detect light and output an electrical signal in response to the light. The magnitude of the output electrical signal is indicative of the intensity of the light that reaches the pixel.

CCDs can sense light from a light source. The pixels in the CCD sense light and output signals indicative of the intensity of the impinging light rays. The output signals are stored in vertical shift registers located on the semiconductor wafer. The output signals are then read out of the CCD and used to produce an image of the object. CCDs are very sensitive to light. Therefore, the image produced can be a very accurate reproduction of the object. CCDs can be used to build an imaging device or a camera.

Previously known charge coupled devices have typically been too small to capture light from a large area. It would therefore be desirable to provide a large area charge coupled device that can provide image data at a frame rate fast enough for video images.

BRIEF SUMMARY OF THE INVENTION

The present invention provides large area CCDs that provide image data at a frame rate fast enough to produce video images. Charge coupled devices of the present invention can have a large photo sensing area. The charge coupled devices have rows and columns of pixels (i.e., photosites).

Each photosite includes a pinned photodiode. The pinned photodiodes have a relatively high quantum efficiency. Also, the charge carriers in the pinned photodiodes can be depleted easily at normal operating voltages. This means that charge can be transferred out of the photodiodes at a fast frame rate with minimal residual charge left behind.

Each column of photosites in a charge coupled device (CCD) of the present invention has a corresponding vertical shift register. The vertical shift registers are located in between the photosites. A charge coupled device with alternating photosites and vertical shift registers is called an interline transfer CCD. Because the vertical shift registers are close to each photodiode, the charge only needs to be transferred a short distance from the photodiodes to the vertical shift registers. This feature also increases the frame rate.

The vertical shift registers store charge signals generated at the photosites. The charge signals are then transferred along the vertical shift registers and stored in horizontal shift registers. The vertical shift registers have doping gradients that facilitate the transfer of charge along the vertical shift registers. The doping gradients allow charge to be transferred along the vertical shift registers at a fast frame rate.

DETAILED DESCRIPTION OF THE INVENTION

Figure 1:
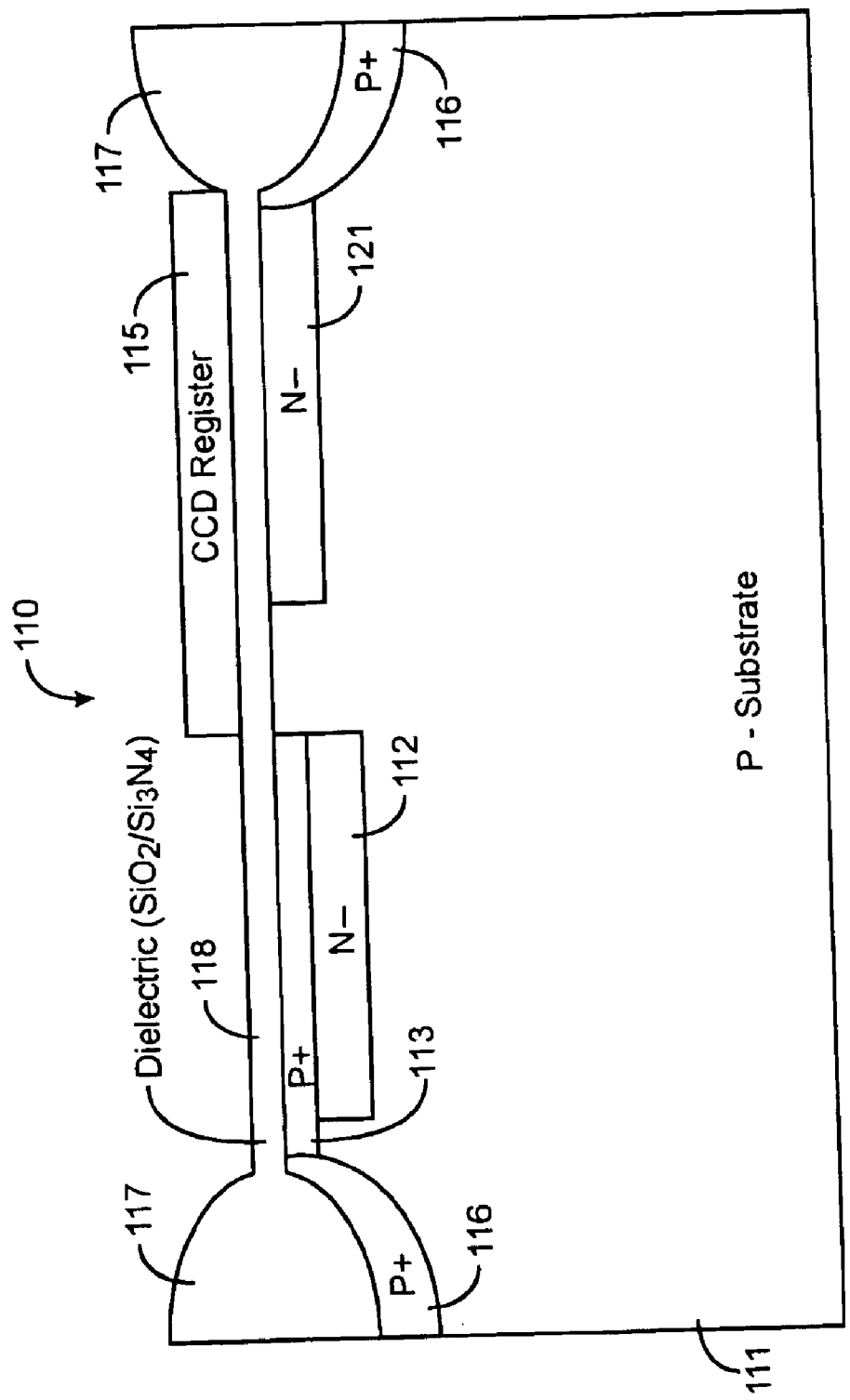
FIG. 1 illustrates cross-sectional view of a pinned photodiode photosite, in accordance with the present invention.

FIG. 1 illustrates the structure of a pinned photodiode photosite 110. Pinned photodiode 110 can be formed on an interline transfer charge coupled device (CCD) in accordance with the present invention. Pinned photodiode 110 is formed in a P-type semiconductor substrate 111. Each photodiode 110 in a charge coupled device is next to a vertical shift register as shown in FIG. 1. The vertical shift register includes polysilicon gate 115 and N-region 121. Examples of steps that can be used to form pinned photodiode 110 are now discussed.

N-type dopant (e.g., Phosphorous) is implanted and diffused into P-substrate 111 in region 112. For example, the N-type dopant may be implanted at a concentration in the range of $2 \times 10^{12}$–$5 \times 10^{12}$ dopants/cm$^2$. A specific example of an implant doping concentration for region 112 is $3 \times 10^{12}$ dopants/cm$^2$.

Subsequently, a high concentration of P-type dopant (e.g., boron) is implanted and diffused into P-substrate 111 in region 113. For example, the P-type dopant may be implanted at a concentration in the range of $1 \times 10^{13}$–$2 \times 10^{13}$ dopants/cm$^2$.

The P-type dopant is diffused into a shallow region 113. For example, region 113 may be about 0.1 μm thick. P+ region 113 is coupled to P-substrate 111, which is coupled to ground. P+ region 113 is connected to P-substrate 111 via P+ region 116.

Photodiode 110 can be sensitive to, for example, visible light, ultraviolet light, and infrared light. When light impinges upon photodiode 110, electrons are formed in N-type region 112. The electrons are subsequently transferred into region 121 of the vertical shift register (when a voltage is applied to a polysilicon gate 115). P+ region 113 helps to control the voltage in N-region 112. A thin dielectric layer 118 covers the semiconductor wafer.

Thick dielectric regions 117 and P+ regions 116 isolate the columns of photodiodes and vertical shift registers. Dielectric regions 117 and 118 may comprise $SiO_2/Si_3N_4$. Thick dielectric regions 117 may be formed, for example, using local oxidation of silicon (LOCOS).

Lag occurs when some of the electrons formed by light in the photodiodes are not transferred into adjacent vertical shift registers. No lag occurs in photodiode 110, because a relatively low concentration of N-type dopant is diffused into region 112. Therefore, all of the electrons are easily depleted from region 112. Also, photodiode 110 has a high quantum efficiency.

Figure 2A:
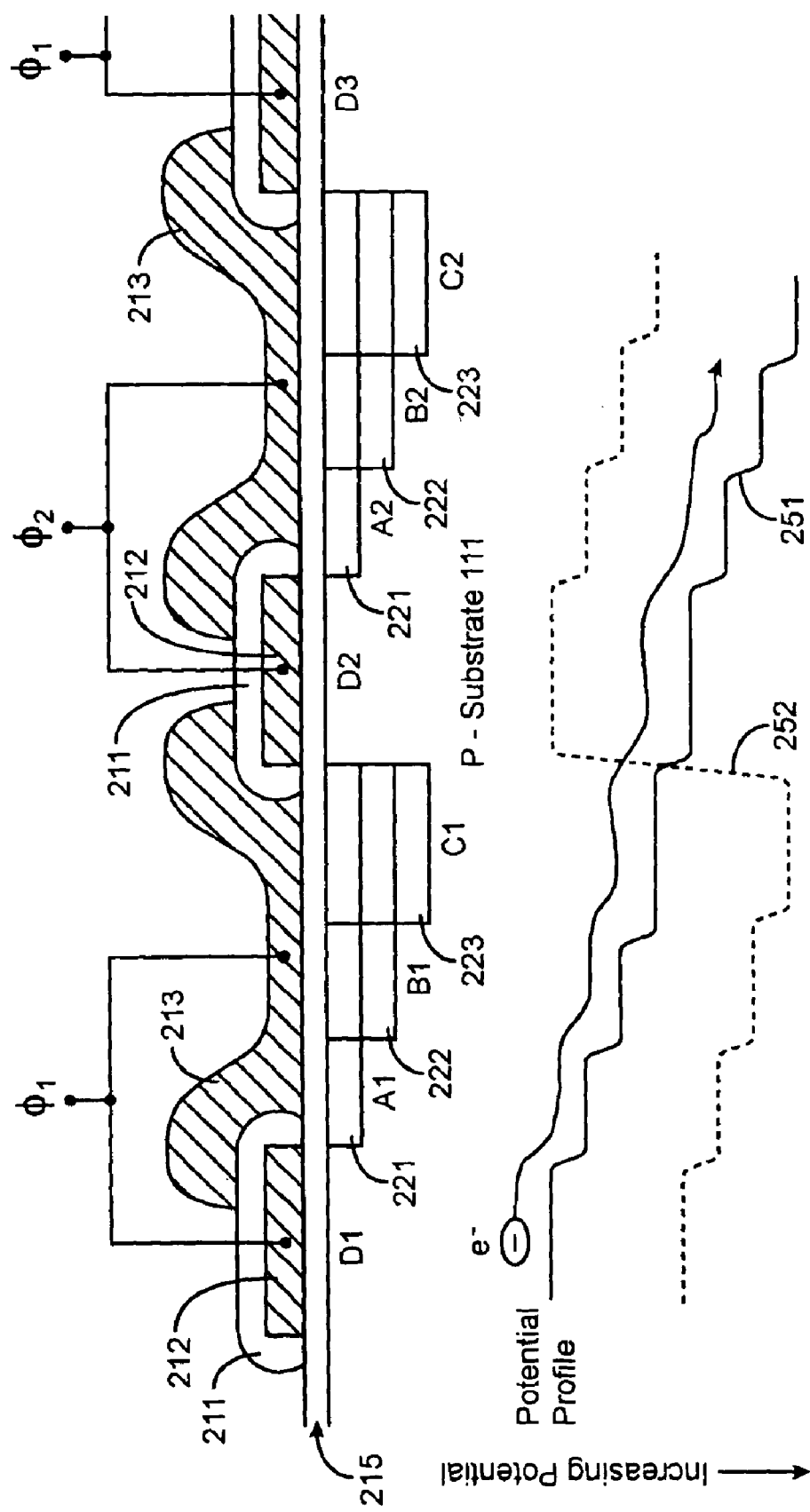
FIG. 2A illustrates a cross-sectional view of a vertical shift register with three doped semiconductor regions under each electrode, in accordance with the present invention.

FIG. 2A illustrates a vertical shift register that can be formed on an interline charge coupled device in accordance with the present invention. The vertical shift register is formed in P-type substrate 111. A dielectric layer 215 is formed over P-type substrate 111. Subsequently, a layer of polysilicon is deposited on dielectric later 215 and patterned to form gate regions 212. Polysilicon regions 212 are then oxidized to form oxide regions 211.

N-type dopant (e.g., phosphorous) is then implanted and diffused into P-substrate 111 to form N-regions 221. For example, the N-type dopant may be implanted at a concentration in the range of $2 \times 10^{11}$–$4 \times 10^{11}$ dopants/cm$^2$. No masking step is used, because, both edges of N-regions 221 are self aligned with oxide regions 211.

Although N-regions 221 are initially self aligned to oxide regions 211, lateral diffusion occurs in N-type regions 221 as a result of subsequent heating steps. This lateral diffusion causes N-regions 221 to essentially line up to polysilicon regions 212, as shown in FIG. 2A. N-regions 221 are not misaligned with respect to gate regions 212, because the formation of N-regions 221 are not effected by a mask layer.

N-type dopant (e.g., phosphorous) is then implanted and diffused into P-substrate 111 to from N-regions 222. For example, the N-type dopant may be implanted at a concentration in the range of $2 \times 10^{11}$–$4 \times 10^{11}$ dopants/cm$^2$. The right edges of N-regions 222 are initially self aligned to the left edges of oxide regions 211. The right edges of regions 222 line up with the left edges of polysilicon regions 212 as a result of subsequent heating steps.

A masking layer is used to position the left edges of N-regions 222 as shown in FIG. 2A. If the masking layer is misaligned so that the left edges of regions 222 are shifted slightly to the right or to the left, the operation of the vertical shift registers is not adversely effected.

N-type dopant (e.g., phosphorous) is then implanted and diffused into P-substrate 111 to from N-regions 223. For example, the N-type dopant may be implanted at a concentration in the range of $2 \times 10^{11}$–$4 \times 10^{11}$ dopants/cm$^2$. The right edges of N-regions 223 are initially self aligned to the left edges of oxide regions 211. The right edges of regions 223 line up with the left edges of polysilicon regions 212 as a result of subsequent heating steps.

A masking layer is used to position the left edges of N-regions 223 as shown in FIG. 2A. If the masking layer is misaligned so that the left edges of regions 223 are shifted slightly to the right or to the left, the operation of the vertical shift registers is not adversely effected.

In one embodiment, N-regions 222 are deeper than regions 221, and N-regions 223 are deeper than regions 222. In other embodiments, regions 222 are the same depth as regions 221, and regions 223 are the same depth as regions 222.

A second polysilicon layer is then deposited and patterned to form gate regions 213 as shown in FIG. 2A. Alternating segments of gate regions 212 and 213 are coupled to one of two electrodes $\Phi_1$ and $\Phi_2$ as shown in FIG. 2A. Electrodes $\Phi_1$ and $\Phi_2$ are clocked out of phase with each other.

Each segment of the vertical shift register under an electrode has a doping gradient. The doping gradient is caused by overlapping N-regions 221–223. The net concentration of N-type carriers increases from regions D, to regions A, to regions B, to regions C. Regions D have no implant. Regions A have one implant, regions B have two overlapping implants, and regions C have three overlapping implants. Diffused N-type regions 221–223 overlap as shown in FIG. 2A.

Regions C have a greater concentration of N-type majority carriers than regions B. Regions B have a greater concentration of N-type majority carriers than regions A. Regions D have the least N-type carriers, because N-type dopant is not diffused into this region. Each segment A–D of the vertical shift register has the same N-type doping gradient.

Regions A1–D1 and A2–D2 are segments of the vertical shift register. The electric fields in regions A1–D1 are effected by the potential applied to electrode $\Phi_1$. The electric fields in regions A2–D2 are effected by the potential applied to electrode $\Phi_2$.

When $\Phi_1$ is LOW and $\Phi_2$ is HIGH, the electric potential under regions A1–D1 and A2–D2 is shown by solid line 251. As the concentration of N-type carriers increases, the electric potential also increases, as shown by line 251. The electric potential steps down across the each of the four regions D, A, B, and C.

When $\Phi_1$ is LOW and $\Phi_2$ is HIGH, the electric potential in regions A2–D2 is higher than in regions A1–D1. Electrons tend to flow to the region with the highest electric potential. Therefore, electrons flow to right from regions A1–D1 to regions A2–D2.

When $\Phi_1$ is HIGH and $\Phi_2$ is LOW, the electric potential under regions A1–D1 and A2–D2 is shown by dotted line 252. When $\Phi_2$ goes LOW the electric potential under regions A2–D2 decreases as shown by line 252. When $\Phi_1$ goes HIGH, the electric potential under regions A1–D1 increases as shown by line 252. The electric potential in regions A1–D1 is now greater than in regions A2–D2.

The electric potential under the next electrode (in regions A3–D3) is the same as shown by line 252 under regions A1–D1. Therefore, electrons flow to the right from regions A2–D2 to regions A3–D3 when $\Phi_1$ is HIGH and $\Phi_2$ is LOW. The doping gradient caused by each of the four regions produces an electric potential gradient that pushes electrons to the right and improves the charge transfer efficiency.

Figure 2B:
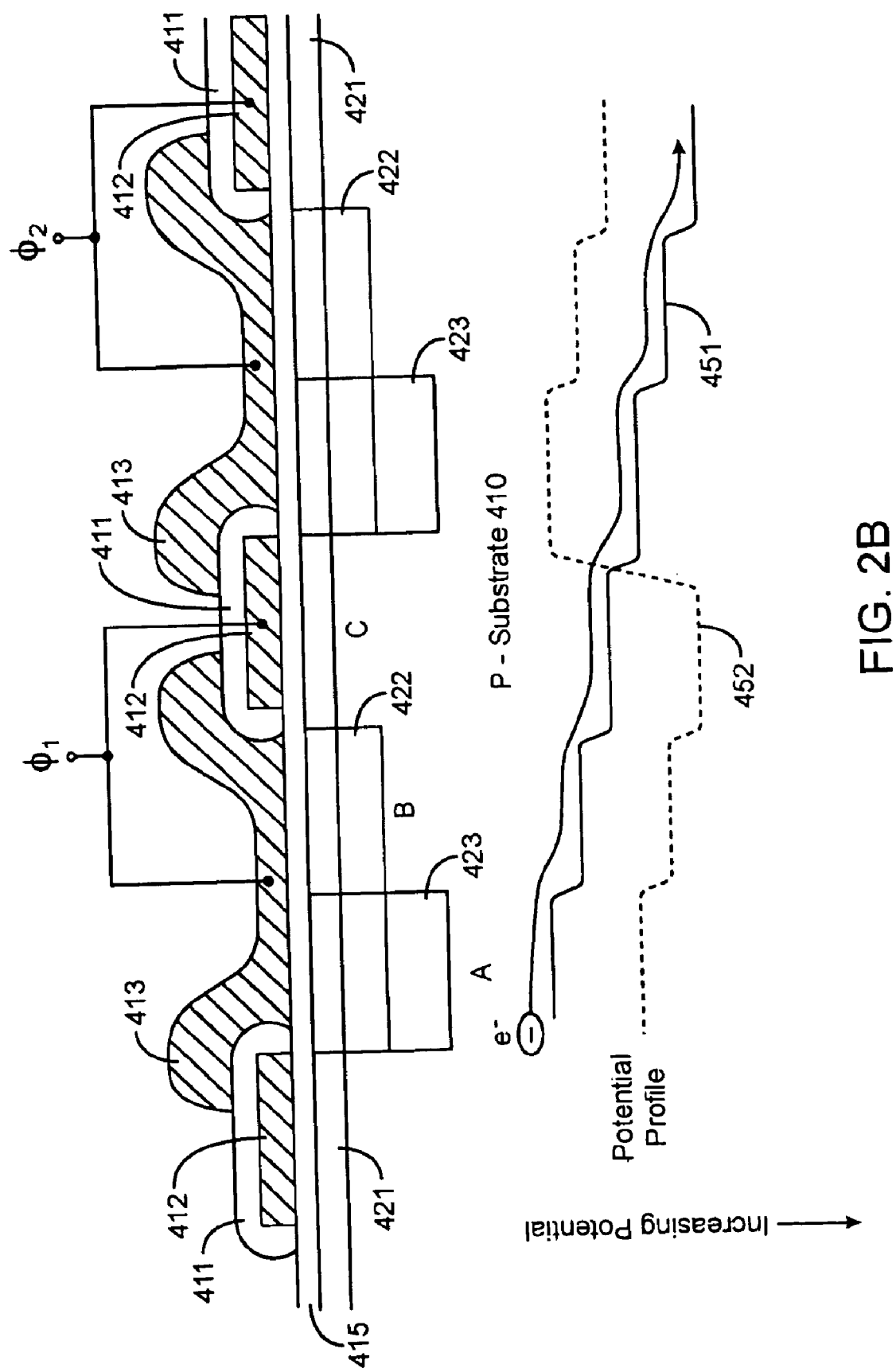
FIG. 2B illustrates a cross-sectional view of a vertical shift register with two doped semiconductor regions under each electrode, in accordance with the present invention.

FIG. 2B illustrates an alternative embodiment of the present invention. A vertical shift register is formed in P-substrate 410. Initially, a dielectric layer 415 is formed over P-type substrate 410.

An overall N-implant is added to the device of FIG. 2B to provide "buried channel" operation. An overall N-implant is formed in photosites and the vertical shift registers to form buried channel region 421. Buried channel region 421 causes a channel to form below the surface of the semiconductor wafer.

Buried channel region 421 is formed by implanting and diffusing N-type dopant into substrate 410. For example, N-type dopant such as Phosphorous may be implanted at a concentration in the range of $1 \times 10^{12}$–$2 \times 10^{12}$ dopant/cm$^2$ to form region 421.

A layer of polysilicon is deposited on dielectric later 415 and patterned to form gate regions 412. Polysilicon regions 412 are then oxidized to form oxide regions 411.

After the formation of gates 412, a first concentration of P-type dopant is implanted and diffused into the wafer to form P-type barrier regions 422 shown in FIG. 2B. No masking layer is needed to form regions 422, because regions 422 are self aligned to oxide regions 411. Subsequent lateral diffusion causes the edges of regions 422 to be aligned with the edges of polysilicon regions 412.

P-type dopant such as Boron may be implanted and diffused at a concentration in the range of, for example, $2 \times 10^{11}$–$5 \times 10^{11}$ dopant/cm$^2$ to form regions 422. A specific example of a dopant concentration is $4 \times 10^{11}$ dopant/cm$^2$.

One-half the region between gates 412 are then masked. A second concentration of P-type dopant is implanted and diffused into the substrate to form P-type barrier regions 423 shown in FIG. 2B. The left edges of regions 423 are self aligned to the right edges of oxide regions 411. Subsequent lateral diffusion causes the left edges of regions 423 to be aligned with the right edges of polysilicon regions 412. A masking layer is used to align the right edges of regions 423.

P-type dopant such as Boron may be implanted and diffused at a concentration in the range of, for example, $2 \times 10^{11} - 5 \times 10^{11}$ dopant/cm$^2$ to form regions 423. A specific example of a dopant concentration is $3 \times 10^{11}$ dopant/cm$^2$.

A second polysilicon layer is then deposited and patterned to form gate regions 413 as shown in FIG. 2B. Alternating segments of gate regions 412 and 413 are coupled to one of two electrodes $\Phi_1$ and $\Phi_2$. Electrodes $\Phi_1$ and $\Phi_2$ are clocked out of phase with each other.

The first and second concentrations of P-type dopant counter-dope N-region 421 to create a three-step gradient of charge carriers under each electrode. This charge carrier gradient alters the net concentration of N-type carriers in diffused region 421 to create the three-step gradient. The concentration of N-type carriers increases from region A, to region B, to region C.

The embodiment of FIG. 2B forms the potential profile shown by lines 451–452. The electric potential gradient in FIG. 2B pushes electrons to the right as the electrodes are clocked out of phase as discussed above with respect to FIG. 2A. The potential gradient improves the charge transfer efficiency of the device.

In further embodiments of the present invention, any number of stepped regions can be formed under each electrode in a vertical shift register. For example, the embodiment of FIG. 2A has three doped regions, and the embodiment of FIG. 2B has two doped regions in addition to the buried channel region. In further embodiments, four doped regions, five doped regions, six doped regions, seven doped regions, and any other suitable number of doped regions can be formed underneath each electrode in the vertical shift register to improve the charge transfer efficiency. These doped regions may, for example, be implanted as counter-doped P-type regions into an N-type buried channel region as discussed with respect to FIG. 2B. In other embodiments, the doped regions may be P-type regions implanted into an N-type substrate, or N-type regions implanted into a P-type substrate.

The photosite pitch on charge coupled devices of the present invention can be relatively large. For example, each photosite may have dimension of 39 $\mu$m×39 $\mu$m. The entire charge coupled device may, for example, have dimensions of 80 mm×80 mm.

Typically, a larger electric field is required to move electrons across a large area CCD. The doping gradient in the vertical shift registers of the present invention substantially improves the charge transfer efficiency in large area CCDs without the need to apply a higher potential to the polysilicon regions. The structures shown in FIGS. 2A–2B allow charge to be transferred quickly and efficiently across columns of vertical shift registers in a large area CCD.

An interline transfer CCD allows charge signals indicative of one video frame to be transferred out of the photosites, while charge indicative of the next video frame is forming in the photosites. Thus, interline transfer CCDs can sense light for the current video frame, while simultaneously causing signals indicative of the previous video frame to be stored in the vertical shift registers. Interline transfer CCDs do not require that the illumination source be shuttered or turned off between frames, which is typical of full frame transfer CCDs.

Therefore, interline transfer CCDs provide an ideal structure for producing video images. Interline transfer CCDs can sense light continuously and can produce image data that can be used to form video frames. No light is lost in between video frames.

Interline transfer CCDs are particularly useful for building video cameras that can be used in fluoroscopic surgical procedures such as x-ray vascular imaging sensors. X-rays can be converted to visible light using a scintillator. The light is then provided to the CCDs using optical fibers.

CCDs are highly sensitive to light. In a CCD camera that converts x-rays to visible light, low doses of x-rays can be used to provide an adequate image of a patient's body. Therefore, a patient can be exposed to x-rays for a longer period of time during surgery before a maximum allowable dose of radiation is reached.

It may be desirable to sense light from a large area on a patient's body. To provide a large imaging area, a CCD can have large dimensions. The photosites in the CCD can also have large dimensions. To further increase the imaging area, several CCDs can be placed next to each to other on a common plane to form a CCD array camera (e.g., a 2×2 array of CCDs).

Figure 3:
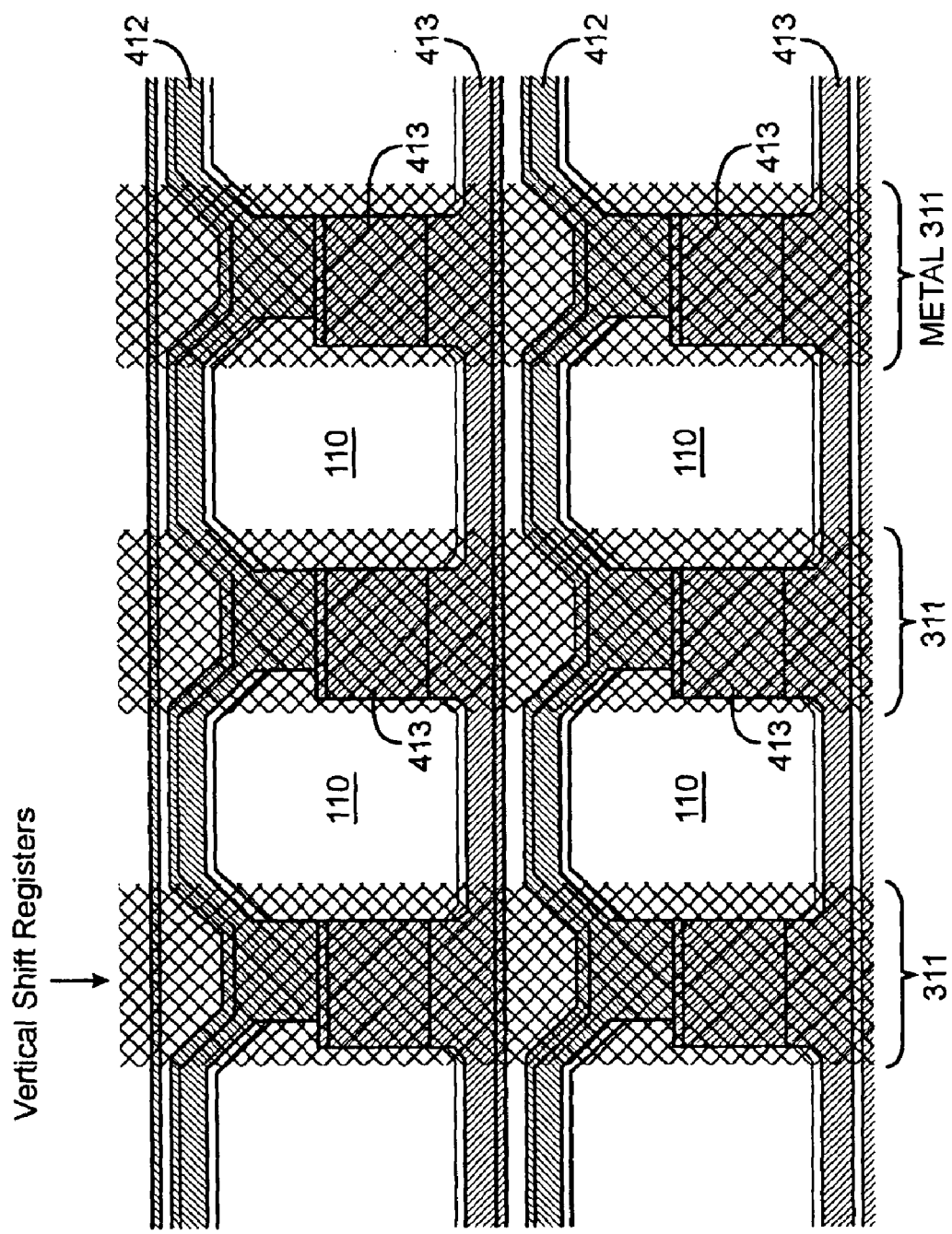
FIG. 3 illustrates a top down view of an interline transfer charge coupled device with interleaved photodiodes and vertical shift registers, in accordance with the present invention.

FIG. 3 illustrates a top down view of an interline transfer CCD in accordance with the present invention. Pinned photodiodes 110 are formed in an array of rows and columns in the CCD. The photodiodes are also referred to as pixels or photosites. Each photosite generates charge signals in response to light impinging upon the CCD. The charge signals formed in each photosite are transferred to an adjacent vertical shift register and then shifted out of the CCD.

In an interline transfer CCD, the vertical shift registers are interleaved in between the photodiodes as shown in FIG. 3. The vertical shift registers are formed under light shield metal layers 311.

Interline transfer CCDs can provide a fast data transfer rate. The charge signals in an interline transfer CCD are only transferred a short distance to from each photodiode to an adjacent vertical shift register. Because the vertical shift registers are located next to each photosite, an interline transfer CCD provides a fast and efficient data transfer mechanism. This particularly important in large area CCDs, in which the charge signals have to travel a longer distance to be read out of the CCD.

Thus, an interline transfer CCD provides a fast and efficient way to transfer charge formed in the photosites out of the CCD quickly. A fast video frame rate is typically required for video cameras. A fast data transfer rate is necessary to provide a fast video frame rate.

Interline transfer CCDs do not require a separate frame storage area on the wafer. A separate frame storage area reduces the photo-sensitive area on the chip. The disadvantage of the interline transfer CCD is the reduction in the photo-sensitive area per pixel or fill factor. This is because the vertical shift registers are located between each column of photosites. In addition to the vertical shift registers, semi-transparent polysilicon bus lines cover additional area on the chip. As a result, the fill factor is typically around 50% in an interline transfer CCD.

Metal regions 311 (e.g., aluminum) are formed on top of the vertical shift registers. Metal regions 311 act as a light shield that protects the vertical shift registers from light impinging upon the CCD. If light were to enter the vertical shift registers, additional charge could form in the registers, distorting the charge signals transferred in from the photosites. Light shield 311 protects the image data of the previous video frame from being contaminated by light forming the current video frame.

Polysilicon regions 412 and 413 are routed around the periphery of the photosites so as not to block incoming light from the light source.

In summary, a large area, fast frame rate video cameras are provided by the present invention. The video cameras use interline transfer CCDs that have pinned photodiodes and vertical shift registers with doping gradients. The interline transfer CCDs are ideal for producing fast frame rate video images from a continuous light source.

The pinned photodiodes sense light for a video frame at each pixel. The photodiodes transfer charge indicative of the previous video frame to an adjacent vertical shift register with little or no lag, while light from the current video frame is integrating in the photodiodes. The charge signals only have to travel a short distance from a photodiode to an adjacent vertical shift register. The charge signals indicative of each video frame are then shifted out of the vertical shift registers. Each vertical shift register has a doping gradient under each electrode that increases the charge transfer rate. All of these factors provide a fast and efficient video frame rate, even in a large area CCD.

After signals generated in the photosites are shifted out of the vertical shift registers, they are stored in horizontal shift registers. In a further embodiment of the present invention, the horizontal shift registers can have the structure shown in FIG. 2A or FIG. 2B.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. An interline transfer charge coupled device comprising:
   columns of pinned photodiodes formed in a semiconductor; and
   vertical shift registers interleaved in between each of the columns of pinned photodiodes,
   wherein each of the vertical shift registers comprises:
   (a) a first gate over the semiconductor, wherein a region of the semiconductor beneath the first gate has a first electric potential;
   (b) a first doped region in the semiconductor next to the region of the semiconductor beneath the first gate, the first doped region having a second electric potential that is greater than the first electric potential;
   (c) a second doped region in the semiconductor next to the first doped region, the second doped region having a third electric potential that is greater than the second electric potential;
   (d) a third doped region in the semiconductor next to the second doped region, the third doped region having a fourth electric potential that is greater than the third electric potential; and
   (e) a second gate over the first, the second, and the third doped regions, the first gate being coupled to the second gate and to an electrode.

2. The interline transfer charge coupled device of claim 1 wherein the semiconductor comprises a buried channel layer, and the first and second doped regions are formed by counter doping the buried channel layer.

3. The interline transfer charge coupled device of claim 1 wherein
   the first, the second, and the third doped regions in the semiconductor are P-type regions.

4. The interline transfer charge coupled device of claim 3 wherein:
   each of the first doped regions comprise a portion of a first region of diffused dopant;
   each of the second doped regions comprise a portion of a second region of diffused dopant that overlaps a portion of the first region of diffused dopant; and
   each of the third doped regions comprise a portion of a third region of diffused dopant that overlaps a portion of the second region of diffused dopant and a portion of the first region of diffused dopant.

5. The interline transfer charge coupled device of claim 4 wherein each of the first regions of diffused dopant are aligned in between two of the first gates.

6. The interline transfer charge coupled device of claim 5 wherein one edge of each of the second regions of diffused dopant is aligned to one of the first gates, and one edge of each of the third regions of diffused dopant is aligned to one of the first gates.

7. The interline transfer charge coupled device of claim 5 wherein the vertical shift registers are covered by a metal layer.

8. The interline transfer charge coupled device of claim 7 wherein the metal layer comprises aluminum.

9. A interline transfer charge coupled device comprising:
   columns of pinned photodiodes formed in a semiconductor wafer; and
   vertical shift registers interleaved in between each of the columns of pinned photodiodes,
   wherein each of the vertical shift registers comprises:
   (a) a first gate over the semiconductor, wherein a region of the semiconductor beneath the first gate has a first electric potential;
   (b) a first doped region in the semiconductor next to the region of the semiconductor beneath the first gate, the first doped region having a second electric potential that is greater than the first electric potential;
   (c) a second doped region in the semiconductor next to the first doped region, the second doped region having a third electric potential that is greater than the second electric potential;
   (d) a third doped region in the semiconductor next to the second doped region, the third doped region having a fourth electric potential that is greater than the third electric potential; and
   (e) a second gate coupled to the first gate and an electrode, the second gate being over the first, the second, and the third doped regions.

10. The interline transfer charge coupled device of claim 9 wherein
    overlapping regions between first areas of diffused dopant, second areas of diffused dopant, and third areas of diffused dopant form the third doped regions.

11. The interline transfer charge coupled device of claim 10 wherein each of the first areas of diffused dopant are aligned in between two of the first gates.

12. The interline transfer charge coupled device of claim 9 further comprising a buried channel region, and wherein the first and the second doped regions are formed by counter doping the buried channel region.

13. The interline transfer charge coupled device of claim 9 wherein the vertical shift registers are covered by a metal layer.

14. The interline transfer charge coupled device of claim 9 wherein the first, the second, and the third doped regions in the semiconductor are N-type regions.

15. The interline transfer charge coupled device of claim 9 wherein the region of the semiconductor beneath the first gate in each of the vertical shift registers does not have a doped region formed by diffusion.

* * * * *